United States Patent [19]

Clemens

[11] 4,261,076
[45] Apr. 14, 1981

[54] UNITARY CARD HANDLING MEANS

[75] Inventor: Donald L. Clemens, The Colony, Tex.

[73] Assignee: Thermalloy Incorporated, Dallas, Tex.

[21] Appl. No.: 120,053

[22] Filed: Feb. 11, 1980

[51] Int. Cl.³ .............................................. A47B 95/02
[52] U.S. Cl. ........................................ 16/112; 16/115; 74/523
[58] Field of Search ................. 16/150, 123, 115, 112, 16/110 R; 74/543, 523

[56] References Cited

U.S. PATENT DOCUMENTS

| 656,140 | 8/1900 | Kennedy | 74/523 |
| 1,861,572 | 6/1932 | Jackson et al. | 74/519 X |
| 3,665,552 | 5/1972 | Toldo | 16/150 X |
| 3,878,736 | 4/1975 | Main et al. | 74/523 X |
| 3,912,140 | 10/1975 | Franges | 16/110 R X |

Primary Examiner—Andrew V. Kundrat
Attorney, Agent, or Firm—Kanz & Timmons

[57] ABSTRACT

Disclosed is a unitary body comprised of relatively rigid complementary halves interconnected along their common edges by a flexible hinge. The laterally extending body portions are of reduced thickness with respect to the joined edges so that upon folding the complementary halves about the hinge, an elongated handle is formed having a channel extending therethrough parallel with the hinge. One laterally extending body member carries a pin extending therefrom which mates with an aperture in the opposing complementary half and bridges the channel. The pin is inserted through an aperture in a card-like structure near a corner thereof so that the unitary body may pivot about the corner of the card-like structure.

5 Claims, 4 Drawing Figures

UNITARY CARD HANDLING MEANS

This invention relates to apparatus for handling card-like structures such as circuit boards, circuit module cards and the like. More particularly, it relates to a foldable unitary body forming a pivot lever or handle for attachment to such card-like structures to aid in inserting and removing the card-like structures from receptacles therefor.

Various electronic apparatus such as telephone switching equipment, electronic control panels, computers and the like employ a plurality of card-like structures which carry and electrically interconnect various discrete electronic device packages to form electrical circuits or circuit functions. Ordinarily, such card-like structures include pins or connector pads adjacent one edge thereof for forming electrical interconnections with mating receptacles so that a plurality of cards may be arranged parallel and electrically interconnected by means of a common mother board arranged normal to the plane of the circuit cards.

Conventionally, the card-like structures are printed circuit boards of like dimensions which are mounted parallel and closely spaced within a housing or rack with the mother board forming the back or bottom side of the housing. Since the connector pads or pins mate with receptacles on a mother board which is remote from the open end of the housing, and since the card-like structures are closely spaced, it is sometimes difficult to remove a card from the housing without damaging the card, components on the card, or the receptacles on the mother board. In order to withdraw a card from the housing or rack, it is preferred that the card be withdrawn uniformly in the mounting plane of the card without twisting or rotating the card in the mounting plane. Furthermore, if the card is allowed to rotate in the mounting plane during insertion or withdrawal thereof, the card may not only become damaged but may become jammed in the mounting housing or the connector pads or pins may become mis-aligned.

In accordance with the present invention a unitary body is provided which may be folded and attached to the card-like structure forming a pivotable handle to aid in handling the card, particularly in removal of such cards from their mounting housings. The unitary handle comprises a pair of complementary members attached along their common edges by flexible hinge means. A pivot pin carried by one of the complementary members passes through an appropriately positioned aperture in the card-like structure and mates with an aperture in the other complementary member to secure the handle to the card and hold the complementary members together in the form of a unitary pivotable handle without the use of any mounting hardware or the like. One end of the handle body extends past the edge of the card to abut against the housing or mounting rack and act as a lever to uniformly withdraw the card from the housing when the handle is rotated about the pivot pin. The handle may be pivoted to position its longer edge parallel with the front edge of the card and stored in a position ready for use in extracting the card from its mounting housing.

The handle of the invention may be inexpensively formed from any suitable material such as plastic, nylon or the like and, since it occupies little space in its ready position and does not interfere with the mounting supports when the card is in use, may remain on the cards ready for use in extracting the cards from their mounting housings. Because the handle acts as a lever applying pressure to the mounting housing at both lateral edges of the card, use of the pivotable handle of the invention aids in uniform removal of the cards from the mounting housing and thereby greatly reduces distortion or damage to the connector pads or pins during removal of the card from the mounting housing. Furthermore, since the handle of the invention is a unitary body, no mounting hardware or tools are required to attach the handle to the card-like structure. Other features and advantages of the invention will become more readily understood from the following detailed description taken in connection with the appended claims and attached drawings in which:

For clarity of illustration, the invention will be described herein with particular reference to use of the card handle in connection with a printed circuit board. However, it will be understood that the printed circuit board is merely illustrative of a variety of structures which may utilize the invention. Accordingly, the term "card-like structure" is used to herein to describe any structure of essentially rectangular dimensions having opposed major faces and which is mounted in a housing, rack or the like in use with its lateral edges adjacent or supported by an enclosing or mounting structure.

Figure 3:
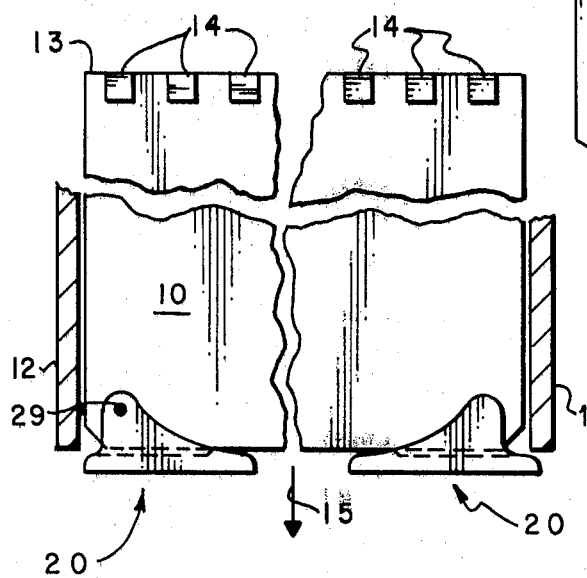
FIG. 3 is a top plan view of a portion of a representative card-like structure in a mounting housing utilizing the card handle of the invention.

Ordinarily, printed circuit boards are approximately 0.06 inch thick and carry a plurality of discrete semiconductor device packages mounted on one or both sides thereof electrically interconnected by printed conductive circuitry. Conventionally, a plurality of such printed circuit boards may be arranged mutually parallel in a mounting housing, bracket or rack. As illustrated in FIG. 3, a printed circuit board 10 is mounted horizontally within a vertically extending housing having vertical parallel sides 11 and 12. Guides, tracks or the like (not illustrated) carried by the sides 11 and 12 may be used to support the board and align the rear edge 13 of the board 10 with electrical connector receptacles on a mother board (not illustrated). The rear edge 13 of the board 10 carries a plurality of connector pads 14 which are adapted to mate with electrical receptacles in the mother board. Such arrangements and interconnections of circuit boards are conventional and well understood by those skilled in the art, thus will not be described in detail herein.

It will be observed that when a plurality of such circuit boards 10 are arranged parallel and closely spaced in a rack or the like, they may be removed only by pulling the boards in the direction indicated by arrow 15. Unless care is exercised in removing such boards, they may twist in t he mounting guides or tracks and become lodged in the mounting housing. Furthermore, if the boards are allowed to twist during extraction from the housing, the mounting pads 14 or the receptacles with which they mate may be damaged. It should be realized that in many cases laterally extending pins may be employed instead of mounting pads 14. Accordingly, where pins are employed, twisting of the board during extraction or insertion thereof may cause mis-alignment or breakage of the pins and thereby render the board unuseable.

Figure 1:
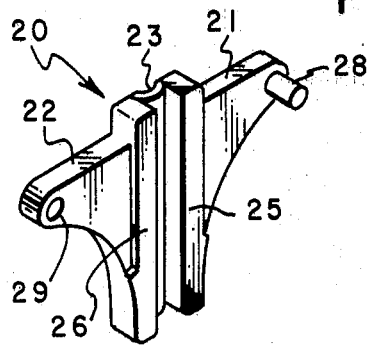
FIG. 1 is a perspective view of the preferred embodiment of the handle of the invention illustrated in the open condition.
Figure 2:
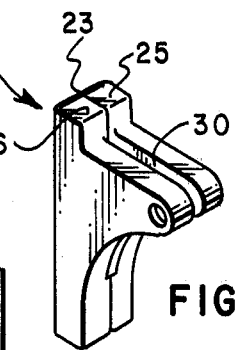
FIG. 2 is a perspective view of the article of FIG. 1 showing the handle in the folded closed position.
Figure 4:
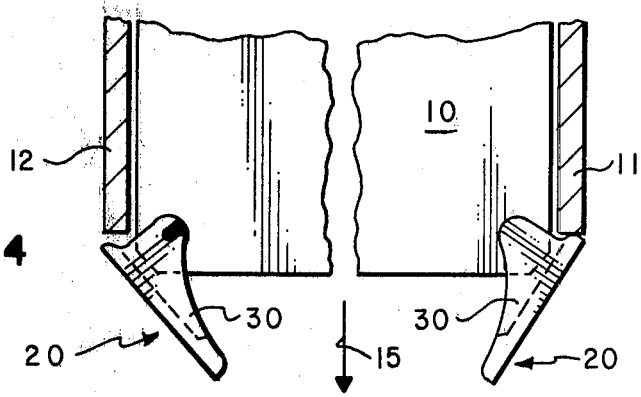
FIG. 4 is a top plan view of the assembly of FIG. 3 illustrating use of the handle of the invention to extract the card from the housing.

In accordance with the invention a unitary body, generally indicated at 20, is adapted to fold about the edge of a circuit board and mate with an aperture in the board 10 to act as a pivoting lever or handle for extracting the board from the mounting housing. In the preferred embodiment the handle 20, as more clearly illustrated in FIG. 1, comprises a pair of substantially rigid complementary halves 21 and 22 joined by a flexible hinge member 23. Each half 21 and 22 comprises a body elongated in a first direction forming opposed parallel relatively rigid beams 25 and 26 spaced apart but interconnected by a flexible hinge portion 23. Each half 21 and 22 includes a body portion extending laterally therefrom and the halves 21 and 22 are complementary so that when halves 21 and 22 are folded toward each other they form an essentially L-shaped structure as illustrated in FIG. 2. The first half 21 carries a pivot pin 28 extending therefrom normal to the major face of the body at a point substantially removed from the beam 25. Likewise, mating half 22 carries an aperture 29 which mates with and receives pivot pin 28 when the body halves are folded together as illustrated in FIG. 2. The laterally extending portions of each half are of reduced thickness with respect to beams 25 and 26 so that when the body 20 is folded to the closed position as illustrated in FIG. 2, the laterally extending body portions form a channel 30 therebetween. Where the handle 20 is to be used in connection with a card-like structure which is approximately 0.60 inch in thickness, the channel 30 should likewise be of at least 0.60 inch in width. Thus, in attaching the handle 20 to the circuit board 10, the pin 28 is inserted through an aperture in the circuit board near the corner thereof and the body 20 is then folded so that pin 28 mates with aperture 29. The handle 20 may therefore rotate about the axis of the pivot pin 28 as illustrated in FIG. 4. It will be understood that the pivot pin 28 should be positioned relatively near the outer extremity of the first half 21 and the channel 30 sufficiently deep to permit the pin 28 to pass through an appropriately positioned aperture in the board when the board 10 is fitted within the channel 30. Preferably, the aperture in the board 10 is equidistant from the front edge and one lateral edge of the board 10 so that the handle 20 may be rotated about the corner of the board approximately 90° in the plane of the board 10. As illustrated in FIGS. 3 and 4 the beam portions 25 and 26 form the base of the channel 30 and are longer than the laterally extending body members. Thus one end of the handle 20 extends past the lateral edge of the board 10 substantially parallel with the front edge of the board. When the board is inserted in the rack as illustrated in FIG. 3, the beam portions 25 and 26, which form the base of the channel 30, lie in a plane substantially parallel with the front edge of the board 10. Thus the handle 20 does not interfere with full insertion of the board 10 into the housing. However, when the handle 20 is rotated, the outwardly extending ends of the beams 25 and 26 are pivoted toward and contact the sides 11 and 12 of the housing. Thus, as the inner end of the handle 20 is rotated outwardly, the outer ends of the beams 25 and 26 are pressed against the edges of sides 11 and 12 and uniformly withdraw the board 10 from the housing in the direction indicated by arrow 15. It will be observed that when the board 10 has been withdrawn by the handles 20 a sufficient distance to permit the connector pads 14 to clear their receptacles, the board may be readily grasped and removed from the housing manually.

In the preferred embodiment of the invention, the handle 20 is formed by conventional injection molded plastic techniques. The unitary body 20 is formed with the beams 25 and 26 parallel and spaced apart by a distance equal to the cumulative thickness of both beams. The hinge member 23 is a relatively thin sheet of plastic connected between the outer edges of the beams. Thus the width of the hinge strip 23 is equal to twice the thickness of one beam. The hinge is preferrably curved about its width so that the hinge apparatus is concave as viewed from the back side when the body 20 is in the open condition. It will thus by observed that as the inner faces of the laterally extending body members are folded toward each other, the inner faces of the beams 25 and 26 are brought into mutual contact, the hinge 23 is flexed against its curvature, and pin 28 is forced into aperture 29. Pin 28 is a substantially rigid member extending normal to the laterally extending body portion and is sufficiently long to bridge the channel 30 and extend into aperture 29. The outside diameter of pin 28 is substantially the same as the inside diameter of aperture 29. Thus the pin 28 is snugly nested in the aperture 29. Although the hinge member 23 is flexed against its formed curvature, the body 20 is retained in the folded condition due to frictional and bending forces applied to the pin 28 when the body halves are snapped together.

While the invention has been described with particular reference to a molded plastic body for use in connection with printed circuit boards, it will be readily recognized that the invention is not so limited. The unitary body of the invention may be formed by various other methods from various other materials and be used in connection with various other card-like structures. The dimensions of the body, the pin 28 and the channel 30 may, of course, be varied as required to match the dimensions of the card-like structure with which it is to be used. It should also be recognized that when the handle body 20 is made from suitable resilient plastic, it may be removed from the card-like structure at any time by simply reversing the installation procedure without damaging either the body 20 r the card-like structure. Thus the body 20 may be re-used as desired. Of course, use of the handle 20 is not limited to insertion into and extraction of card-like structures from end-use housings. The handles may also be used for handling such card-like structures during the manufacture, testing or repair thereof. It is to be understood, therefore, that although the invention has been described with particular reference to a specific embodiment thereof, the form of the invention shown and described in detail is to be taken as the preferred embodiment thereof. Various changes and modifications may be resorted to without departing from the spirit and scope of the invention as defined by the appended claims.

What is claimed:

1. Means for handling card-like structures comprising a unitary body including a first body member, a second body member complementary with said first body member, and flexible hinge means joining said first body member and said second body member along opposing parallel edges, said first and second complementary body members defining a channel therebetween when folded about said hinge means, wherein said first body member includes a pin projecting therefrom normal to one major face of said first body member and said second body member contains an aperture therein adapted to receive said pin when said bodies are folded about said hinge means with said pin projecting across said channel.

2. Means as defined in claim 1 wherein said first and second body members include parallel opposed beam portions extending in a first direction with said first and second complementary body members extending respectively therefrom, and said hinge means interconnects opposing edges of said beams.

3. Means as defined in claim 2 wherein said beam portions and said complementary body members define a channel extending in said first direction between said complementary body members with said beam portions forming the base of said channel.

4. In combination:
(a) a card-like structure having substantially rectangular dimensions and first and second opposed major faces and an aperture passing therethrough at a location substantially equidistant from first and second intersecting edges; and
(b) pivotable handle means comprising a unitary body including first and second substantially rigid complementary body members having opposed parallel edges joined by a flexible hinge member and defining a channel between said first and second complementary body members, a pin extending from said first complementary body member through said aperture in said card-like structure and into a mating aperture in said second complementary body member with said card-like structure nested within said channel; whereby said pivotable handle may rotate approximately 90° about said pin.

5. The combination defined in claim 4 wherein said aperture and said pin are located to permit positioning the longitudinal axis of said pivotable handle means substantially parallel with either of said intersecting edges.

* * * * *